(12) United States Patent
Minzoni (10) Patent No.: US 7,148,731 B2
(45) Date of Patent: Dec. 12, 2006

(54) DUTY CYCLE CORRECTION

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/300,073

(22) Filed: Dec. 14, 2005

(65) Prior Publication Data

US 2006/0091922 A1    May 4, 2006

Related U.S. Application Data

(62) Division of application No. 10/836,754, filed on Apr. 30, 2004, now Pat. No. 7,005,904.

(51) Int. Cl.
*H03K 3/017* (2006.01)
(52) U.S. Cl. ........................ 327/175; 327/172
(58) Field of Classification Search ............... 327/31, 327/170, 172, 173, 174, 175, 176, 231; 331/175
See application file for complete search history.

(56) References Cited

U.S. PATENT DOCUMENTS

| | | | |
|---|---|---|---|
| 4,527,075 A | 7/1985 | Zbinden | 307/265 |
| 5,572,158 A | 11/1996 | Lee et al. | 327/175 |
| 5,757,218 A | 5/1998 | Blum | 327/175 |
| 5,945,857 A | 8/1999 | Havens | 327/175 |
| 6,040,726 A | 3/2000 | Martin | 327/175 |
| 6,066,972 A | 5/2000 | Strom | 327/175 |
| 6,169,434 B1 | 1/2001 | Portmann | 327/175 |
| 6,181,178 B1 | 1/2001 | Choi | 327/175 |
| 6,285,226 B1 | 9/2001 | Nguyen | 327/175 |
| 6,320,438 B1 | 11/2001 | Arcus | 327/175 |
| 6,342,801 B1 | 1/2002 | Shin | 327/175 |
| 6,384,652 B1 | 5/2002 | Shu | 327/175 |
| 6,411,145 B1 | 6/2002 | Kueng et al. | 327/175 |
| 6,426,660 B1 | 7/2002 | Ho et al. | 327/175 |
| 6,459,314 B1 | 10/2002 | Kim | 327/161 |
| 6,466,071 B1 | 10/2002 | Kim et al. | 327/175 |
| 6,496,045 B1 | 12/2002 | Nguyen | 327/115 |
| 6,507,220 B1 | 1/2003 | Groen et al. | 326/93 |
| 6,518,809 B1 | 2/2003 | Kotra | 327/175 |
| 6,535,040 B1 | 3/2003 | Jung et al. | 327/175 |
| 6,542,015 B1 | 4/2003 | Zhou et al. | 327/172 |
| 6,578,154 B1 | 6/2003 | Wynen et al. | 713/500 |
| 6,583,657 B1 | 6/2003 | Eckhardt et al. | 327/175 |
| 6,603,337 B1 | 8/2003 | Cho | 327/149 |
| 6,639,441 B1 | 10/2003 | Ono et al. | 327/175 |
| 6,643,790 B1 | 11/2003 | Yu et al. | 713/500 |
| 6,677,792 B1 | 1/2004 | Kwak | 327/158 |
| 6,680,637 B1 | 1/2004 | Seo | 327/175 |
| 6,687,844 B1 | 2/2004 | Zhang | 713/503 |
| 6,690,202 B1 | 2/2004 | Groen et al. | 326/93 |
| 6,690,218 B1 | 2/2004 | Goldblatt | 327/175 |
| 6,933,759 B1 * | 8/2005 | Wu et al. | 327/172 |
| 2001/0030562 A1 | 10/2001 | Kim et al. | 327/156 |
| 2001/0052805 A1 | 12/2001 | Kim | 327/175 |
| 2002/0084818 A1 | 7/2002 | Cho | 327/175 |
| 2002/0140477 A1 | 10/2002 | Zhou et al. | 327/175 |

(Continued)

*Primary Examiner*—Linh My Nguyen
(74) *Attorney, Agent, or Firm*—Dicke, Billig & Czaja, PLLC (57) ABSTRACT

A duty cycle correction circuit comprises an averaging circuit configured to receive a first signal and a second signal and provide a third signal, a duty restoration circuit configured to receive the third signal and a fourth signal and provide a fifth signal having a duty cycle closer to 50% than the first signal, and a synchronous mirror delay circuit configured to receive the fifth signal and provide the second signal.

18 Claims, 11 Drawing Sheets

U.S. PATENT DOCUMENTS

| | | | |
|---|---|---|---|
| 2002/0140478 A1 | 10/2002 | Fletcher et al. | 327/175 |
| 2002/0196887 A1 | 12/2002 | Heikkila | 375/371 |
| 2003/0048118 A1 | 3/2003 | Nguyen et al. | 327/115 |
| 2003/0102926 A1 | 6/2003 | Hsieh | 331/74 |
| 2003/0111705 A1 | 6/2003 | Seo | 257/491 |
| 2003/0117194 A1 | 6/2003 | Lee | 327/158 |
| 2003/0128061 A1 | 7/2003 | Heyne | 327/175 |
| 2003/0197538 A1 | 10/2003 | Goldblatt | 327/175 |
| 2003/0201806 A1 | 10/2003 | Cho | 327/116 |
| 2003/0218486 A1 | 11/2003 | Kwak | 375/376 |
| 2003/0219088 A1 | 11/2003 | Kwak | 327/158 |
| 2004/0027182 A1 | 2/2004 | Brox et al. | 327/158 |

* cited by examiner

DUTY CYCLE CORRECTION

CROSS-REFERENCE TO RELATED APPLICATIONS

This application is a Divisional of U.S. Application Ser. No. 10/836,754, filed on Apr. 30, 2004 now U.S. Pat. No. 7,005,904, and which is incorporated herewith.

BACKGROUND

Digital circuits require a clock signal to operate. Typically, the clock signal is provided by a crystal oscillator and associated circuitry, which usually does not provide a clock signal having a duty cycle of 50%. For example, the clock signal may have a duty cycle of 45%, where the logic high time of the clock signal is 45% of the clock cycle and the logic low time of the clock signal is the remaining 55% of the clock cycle.

One type of circuit that requires a clock signal to operate is memory, such as dynamic random access memory (DRAM), synchronous dynamic random access memory (SDRAM), and double data rate synchronous dynamic random access memory (DDR-SDRAM). For memory circuits operating at high frequencies, a clock signal having a duty cycle as close to 50% as possible is desired so that the memory has approximately an equal amount of time on both the logic high and logic low portions of the clock signal for transferring data. A duty cycle of 50% allows the maximum amount of time for latching both rising edge data and falling edge data in a memory circuit.

SUMMARY

One embodiment of the invention provides a duty cycle correction circuit. The duty cycle correction circuit comprises an averaging circuit configured to receive a first signal and a second signal and provide a third signal, a duty restoration circuit configured to receive the third signal and a fourth signal and provide a fifth signal having a duty cycle closer to 50% than the first signal, and a synchronous mirror delay circuit configured to receive the fifth signal and provide the second signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
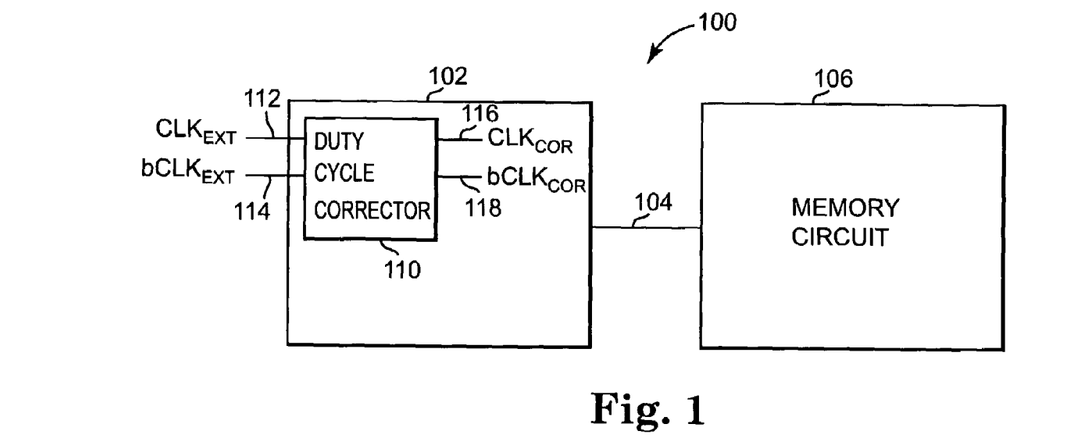
FIG. 1 is a block diagram illustrating one embodiment of a memory system including a duty cycle correction circuit.

FIG. 1 is a block diagram illustrating one embodiment of a memory system 100 including a duty cycle correction circuit. Memory system 100 includes a semiconductor chip 102 and a memory circuit 106. Semiconductor chip 102 is electrically coupled to memory circuit 106 through communication link 104. Semiconductor chip 102 includes duty cycle correction circuit 110. Duty cycle correction circuit 110 is electrically coupled to external clock ($CLK_{EXT}$) signal path 112, inverted external clock ($bCLK_{EXT}$) signal path 114, corrected clock ($CLK_{COR}$) signal path 116, and inverted corrected clock ($bCLK_{COR}$) signal path 118.

Duty cycle correction circuit 110 receives the $CLK_{EXT}$ signal on signal path 112 and the $bCLK_{EXT}$ signal on signal path 114. The duty cycle of the $CLK_{EXT}$ signal and the duty cycle of the corresponding $bCLK_{EXT}$ signal are not 50%. Duty cycle correction circuit 110 corrects the duty cycle by bringing the duty cycle of the $CLK_{EXT}$ signal and duty cycle of the $bCLK_{EXT}$ signal closer to a specified duty cycle, such as 50%, by using a synchronous mirror delay circuit. Duty cycle correction circuit 110 outputs the $CLK_{COR}$ signal on signal path 116 and the $bCLK_{COR}$ signal on signal path 118. In one embodiment, duty cycle correction circuit 110 corrects the duty cycle of the clock signal to 50%. The corrected clock signal is used in the operation of memory circuit 106.

Memory circuit 106 communicates with chip 102 through communication link 104. In one embodiment, the $CLK_{COR}$ signal and the $bCLK_{COR}$ signal are passed to memory circuit 106 through communication link 104 for use in transferring data between memory circuit 106 and chip 102 or another device. Memory circuit 106 includes a random access memory (RAM), dynamic random access memory (DRAM), synchronous dynamic random access memory (SDRAM), double data rate synchronous dynamic random access memory (DDR-SDRAM), or other suitable memory. In one embodiment, memory circuit 106 and chip 102 are a single semiconductor chip.

Figure 2:
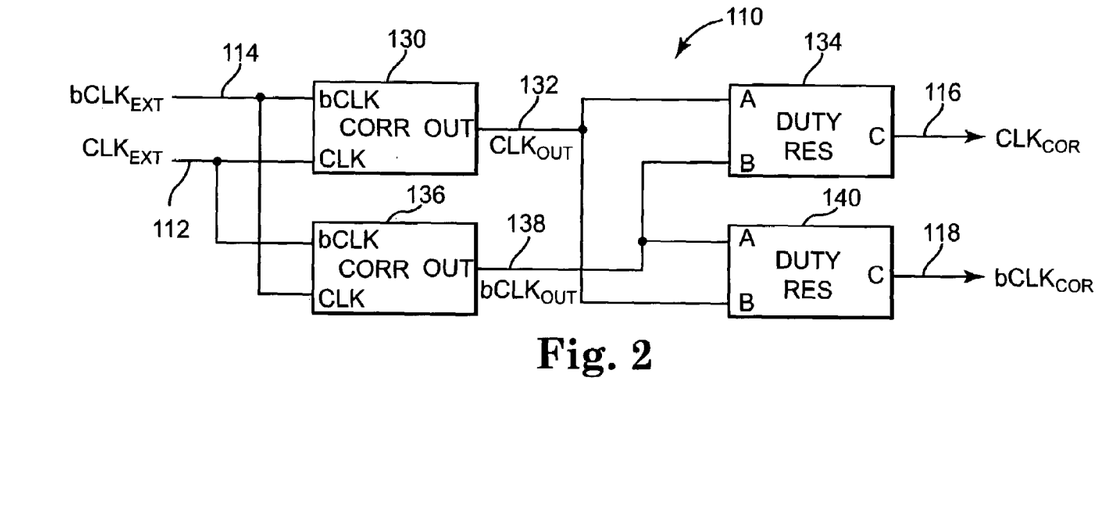
FIG. 2 is a block diagram illustrating one embodiment of a duty cycle correction circuit.

FIG. 2 is a block diagram illustrating one embodiment of duty cycle correction circuit 110. Duty cycle correction circuit 110 includes correction circuits 130 and 136 and duty restoration circuits 134 and 140. The bCLK input of correction circuit 130 is electrically coupled to the CLK input of correction circuit 136 through $bCLK_{EXT}$ signal path 114.

The CLK input of correction circuit 130 is electrically coupled to the bCLK input of correction circuit 136 through $CLK_{EXT}$ signal path 112.

The output of correction circuit 130 is electrically coupled to input A of duty restoration circuit 134 and input B of duty restoration circuit 140 through clock out ($CLK_{OUT}$) signal path 132. The output of correction circuit 136 is electrically coupled to input B of duty restoration circuit 134 and input A of duty restoration circuit 140 through inverted clock out ($bCLK_{OUT}$) signal path 138. The output of duty restoration circuit 134 is electrically coupled to $CLK_{COR}$ signal path 116. The output of duty restoration circuit 140 is electrically coupled to $bCLK_{COR}$ signal path 118. In one embodiment, duty restoration circuit 130 or duty restoration circuit 140 is not included in duty cycle correction circuit 110.

The bCLK input of correction circuit 130 receives the $bCLK_{EXT}$ signal on signal path 114 and the CLK input of correction circuit 130 receives the $CLK_{EXT}$ signal on signal path 112. Correction circuit 130 outputs the $CLK_{OUT}$ signal to input A of duty restoration circuit 134 and input B of duty restoration circuit 140 through $CLK_{OUT}$ signal path 132. The $CLK_{OUT}$ signal has a duty cycle closer to 50% than the $CLK_{EXT}$ signal input into correction circuit 130.

The CLK input of correction circuit 136 receives the $bCLK_{EXT}$ signal on signal path 114 and the bCLK input of correction circuit 136 receives the $CLK_{EXT}$ signal on signal path 112. Correction circuit 136 outputs the $bCLK_{OUT}$ signal to input B of duty restoration circuit 134 and input A of duty restoration circuit 140 through $bCLK_{OUT}$ signal path 138. The $bCLK_{OUT}$ signal has a duty cycle closer to 50% than the $bCLK_{EXT}$ signal input into correction circuit 136.

Input A of duty restoration circuit 134 receives the $CLK_{OUT}$ signal from correction circuit 130 through signal path 132 and input B of duty restoration circuit 134 receives the $bCLK_{OUT}$ signal from correction circuit 136 through signal path 138. Duty restoration circuit 134 outputs the $CLK_{COR}$ signal on signal path 116 based on the $CLK_{OUT}$ signal and the $bCLK_{OUT}$ signal. The $CLK_{COR}$ signal has a logic high time equivalent to the time between the rising edge of the $CLK_{OUT}$ signal and the rising edge of the $bCLK_{OUT}$ signal. The $CLK_{COR}$ signal has a logic low time equivalent to the time between the rising edge of the $bCLK_{OUT}$ signal and the rising edge of the $CLK_{OUT}$ signal.

Input A of duty restoration circuit 140 receives the $bCLK_{OUT}$ signal from correction circuit 136 through signal path 138 and input B of duty restoration circuit 140 receives the $CLK_{OUT}$ signal from correction circuit 130 through signal path 132. Duty restoration circuit 140 outputs the $bCLK_{COR}$ signal on signal path 118 based on the $bCLK_{OUT}$ signal and the $CLK_{OUT}$ signal. The $bCLK_{COR}$ signal has a logic high time equivalent to the time between the rising edge of the $bCLK_{OUT}$ signal and the rising edge of the $CLK_{OUT}$ signal. The $bCLK_{COR}$ signal has a logic low time equivalent to the time between the rising edge of the $CLK_{OUT}$ signal and the rising edge of the $bCLK_{OUT}$ signal.

In operation, the $CLK_{COR}$ signal has the same cycle time as the $CLK_{EXT}$ signal and a duty cycle closer to 50% than the $CLK_{EXT}$ signal. The $bCLK_{COR}$ signal has the same cycle time as the $bCLK_{EXT}$ signal and a duty cycle closer to 50% than the $bCLK_{EXT}$ signal.

Figure 3A:
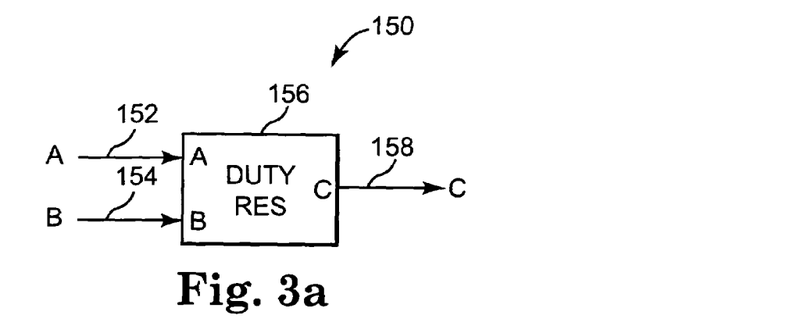
FIG. 3a is a block diagram illustrating one embodiment of a duty restoration circuit.

FIG. 3a is a block diagram illustrating one embodiment of a duty restoration circuit 150. Duty restoration circuit 150 is similar to duty restoration circuit 134 and duty restoration circuit 140. Duty restoration circuit 150 includes duty restoration block 156, input path A 152, input path B 154, and output path C 158.

Figure 3B:
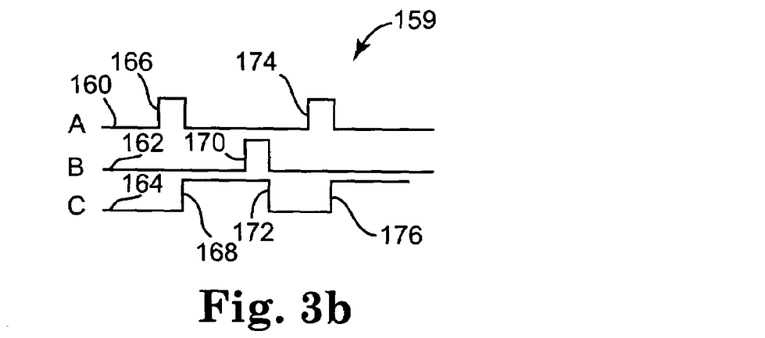
FIG. 3b is a timing diagram illustrating one embodiment of the timing of signals for the duty restoration circuit.

FIG. 3b is a graph 159 illustrating one embodiment of the timing of signals for duty restoration circuit 150. Graph 159 illustrates signal A 160 on input path A 152, signal B 162 on input path B 154, and signal C 164 on output path C 158. In response to the rising edge 166 of signal A, signal C 164 transitions to a logic high at 168. In response to the rising edge 170 of signal B 162, signal C 164 transitions to a logic low at 172. The time between the rising edge 168 of signal C 164 and the falling edge 172 of signal C 164 equals the time between the rising edge 166 of signal A 160 and the rising edge 170 of signal B 162. In response to the next rising edge 174 of signal A 160, signal C 164 again transitions to a logic high at 176. The process repeats for each rising edge of signal A 160 and each rising edge of signal B 162.

Figure 4:
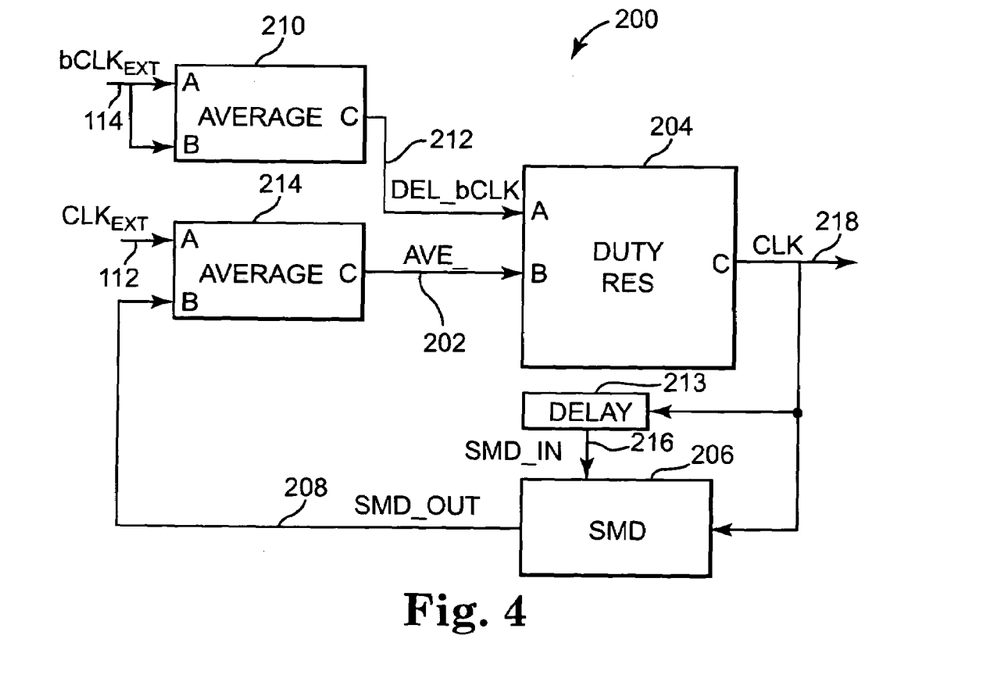
FIG. 4 is a block diagram illustrating one embodiment of a correction circuit.

FIG. 4 is a block diagram illustrating one embodiment of a correction circuit 200. Correction circuit 200 is similar to correction circuit 130. Correction circuit 200 is similar to correction circuit 136, except that the $bCLK_{EXT}$ signal and the $CLK_{EXT}$ signal inputs are swapped. Correction circuit 200 includes averaging circuits 210 and 214, duty restoration circuit 204, delay circuit 213, and synchronous mirror delay circuit (SMD) 206. Duty restoration circuit 204 is similar to duty restoration circuit 150.

Inputs A and B of averaging circuit 210 are electrically coupled to $bCLK_{EXT}$ signal path 114. Inputs A and B of averaging circuit 210 are the bCLK inputs of correction circuits 130 and 136. Output C of averaging circuit 210 is electrically coupled to input A of duty restoration circuit 204 through delayed inverted clock (DEL_bCLK) signal path 212. Input A of averaging circuit 214 is electrically coupled to $CLK_{EXT}$ signal path 112 and input B of averaging circuit 214 is electrically coupled to SMD 206 through synchronous mirror delay output (SMD_OUT) signal path 208.

Input A of averaging circuit 210 is the CLK input of correction circuits 130 and 136. Output C of averaging circuit 214 is electrically coupled to input B of duty restoration circuit 204 through average (AVE) signal path 202. Output C of duty restoration circuit 204 is electrically coupled to the input of delay circuit 213 and an input of SMD 206 through clock (CLK) signal path 218. Output C of duty restoration circuit 204 is the output of correction circuits 130 and 136. The output of delay circuit 213 is electrically coupled to SMD 206 through synchronous mirror delay input (SMD_IN) signal path 216.

Inputs A and B of averaging circuit 210 receive the $bCLK_{EXT}$ signal on signal path 114 and output C of averaging circuit 210 outputs the DEL_bCLK signal to input A of duty restoration circuit 204 through signal path 212. The DEL_bCLK signal on signal path 212 is a delayed $bCLK_{EXT}$ signal, where the delay is equal to the delay through averaging circuit 214.

Input A of averaging circuit 214 receives the $CLK_{EXT}$ signal on signal path 112 and input B of averaging circuit 214 receives the SMD_OUT signal from SMD 206 through signal path 208. Output C of averaging circuit 214 outputs the AVE signal to input B of duty restoration circuit 204 through signal path 202. The AVE signal has a rising edge between the rising edge of the $CLK_{EXT}$ signal and the rising edge of the SMD_OUT signal.

Duty restoration circuit 204 functions similar to duty restoration circuit 150. Duty restoration circuit 204 receives the DEL_bCLK signal on signal path 212 and the AVE signal on signal path 202 and outputs the CLK signal to delay circuit 213 and SMD 206 through signal path 218. The CLK signal has a logic high time equal to the time between the rising edge of the DEL_bCLK signal and the rising edge of the AVE signal.

Delay circuit 213 receives the CLK signal and delays the CLK signal to compensate for the delay through averaging circuit 214 and the delay through duty restoration circuit 204. Delay circuit 213 outputs the delayed CLK signal, SMD_IN, to SMD 206 through signal path 216.

SMD 206 receives the CLK signal and the SMD_IN signal and outputs the SMD_OUT signal to input B of averaging circuit 214. The SMD_OUT signal has a rising edge a logic high time of the CLK signal after the falling edge of the CLK signal, as will be described in further detail with respect to FIG. 6.

Figure 5A:
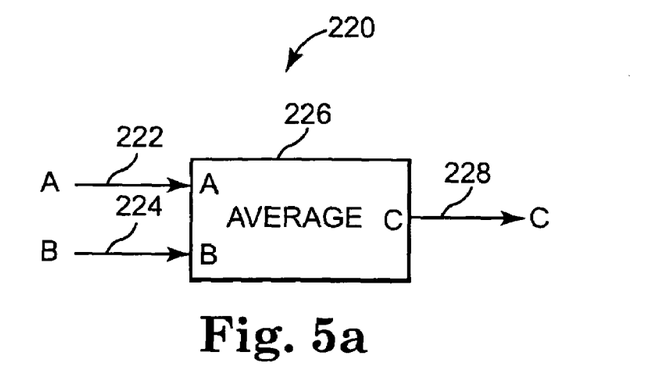
FIG. 5a is a block diagram illustrating one embodiment of an averaging circuit.

FIG. 5*a* is a block diagram illustrating one embodiment of an averaging circuit 220. Averaging circuit 220 is similar to averaging circuit 210 and averaging circuit 214. Averaging circuit 220 includes average circuit 226, input path A 222, input path B 224, and output path C 228.

Figure 5B:
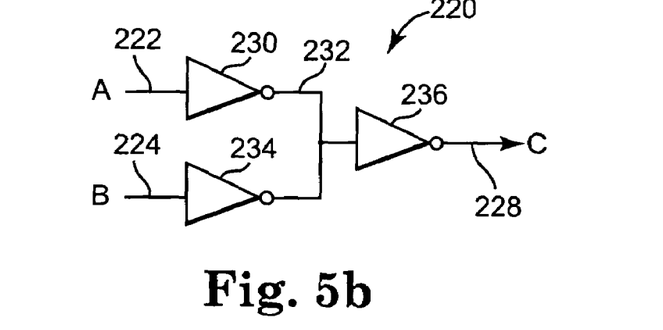
FIG. 5b is a schematic diagram illustrating one embodiment of the averaging circuit.

FIG. 5*b* is a schematic diagram illustrating averaging circuit 220 in more detail. Averaging circuit 220 includes inverters 230, 234, and 236. The input of inverter 230 is electrically coupled to input path A 222 and the output of inverter 230 is electrically coupled to the input of inverter 236 and the output of inverter 234 through path 232. The input of inverter 234 is electrically coupled to input path B 224. The output of inverter 236 is electrically coupled to output path C 228.

Figure 5C:
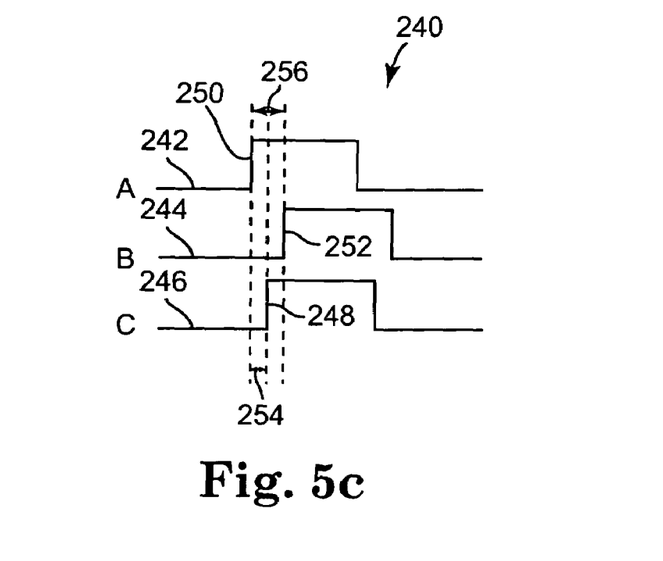
FIG. 5c is a timing diagram illustrating one embodiment of the timing of signals for the averaging circuit.

FIG. 5*c* is a timing diagram 240 illustrating one embodiment of the timing of signals for averaging circuit 220. Timing diagram 240 includes signal A 242 on input path A 222, signal B 244 on input path B 224, and signal C 246 on output path C 228. Signal C 246 has a rising edge 248 between a rising edge 250 of signal A 242 and a rising edge 252 of signal B 244. The time between the rising edge 250 of signal A 242 and the rising edge 248 of signal C 246 is indicated at 254. The time between the rising edge 250 of signal A 242 and the rising edge 252 of signal B 244 is indicated at 256. In one embodiment, the rising edge of signal B 244 leads the rising edge of signal A 242.

Figure 5D:
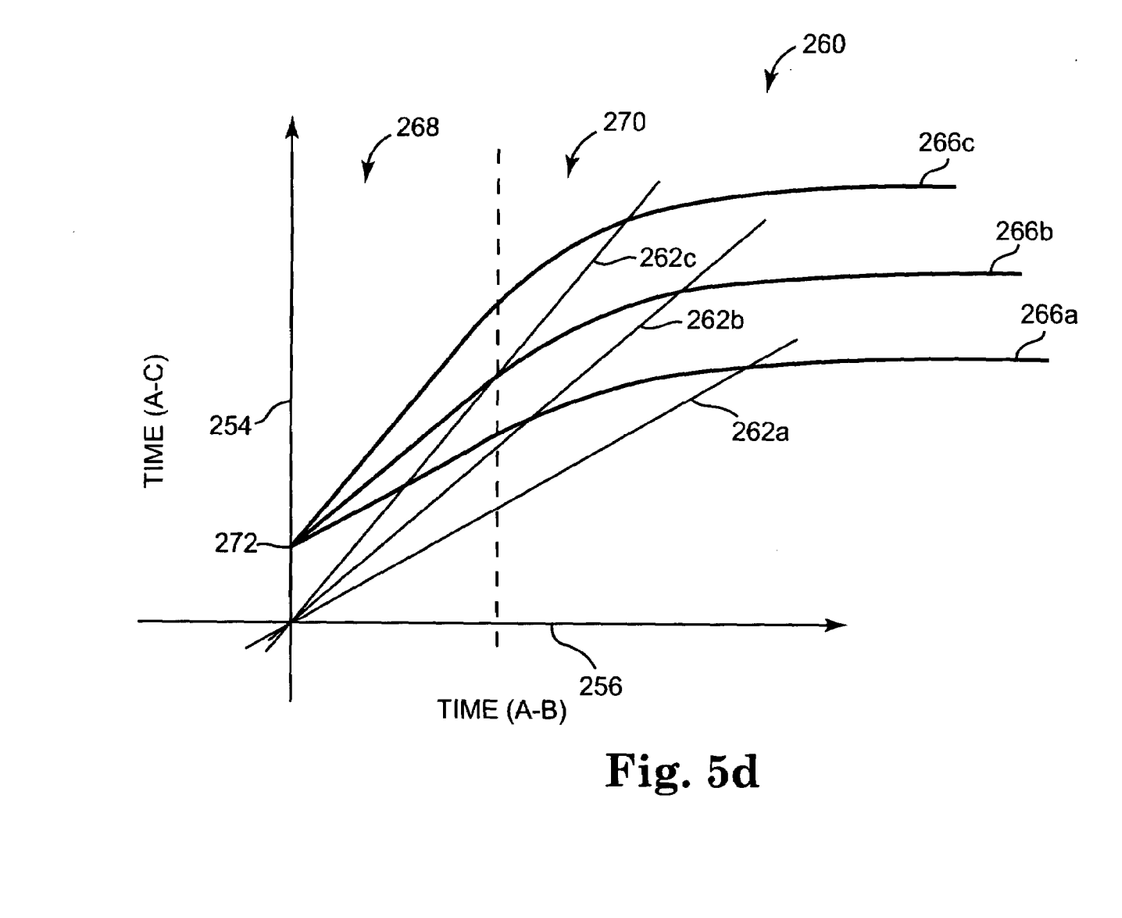
FIG. 5d is a graph illustrating embodiments of the relationship between the delay between the two inputs to the averaging circuit verses the delay between one input and the output of the averaging circuit.

FIG. 5*d* is a graph 260 illustrating three embodiments of the relationship between the time 256 verses the time 254 for averaging circuit 220. The x-axis 256 is the absolute value of the time between the rising edge 250 of signal A 242 and the rising edge 252 of signal B 244 (TIME(A–B)). The y-axis 254 is the time between the rising edge 250 of signal A 242 and the rising edge 248 of signal C 246 (TIME(A–C)). The time 254 is a function of the time 256 based on the design of averaging circuit 220. The function is defined as:

$$\text{TIME}(A-C) = [\text{TIME}(A-B)] X \quad \text{Equation I}$$

where X is slope of a curve in graph 260.

Curves 262*a*, 262*b*, and 262*c* represent three ideal functions for averaging circuit 220 with no delay between input path A 222, input path B 224, and output path C 228. In this case, X=0.4 for curve 262*a*, X=0.5 for curve 262*b*, and X=0.6 for curve 262*c*.

Curves 266*a*, 266*b*, and 266*c* represent three non-ideal functions for averaging circuit 220 and account for a delay between input path A 222, input path B 224, and output path C 228, indicated at 272. In this case, X=0.4 for curve 266*a*, X=0.5 for curve 166*b*, and X=0.6 for curve 266*c*. Averaging circuit 220 acts as an ideal averaging circuit if TIME(A–B) is low, as indicated at 268. As TIME(A–B) increases, however, averaging circuit 220 does not act ideally, as indicated at 270. Averaging circuit 220 is designed based on the frequency of the clock signal that is going to be corrected and the desired amount of duty cycle correction. In one embodiment, where the rising edge of signal B 244 leads the rising edge of signal A 242, TIME(A–C) is replaced with the time between the rising edge of signal B 244 and the rising edge of signal C 246 (TIME(B–C)).

Figure 6:
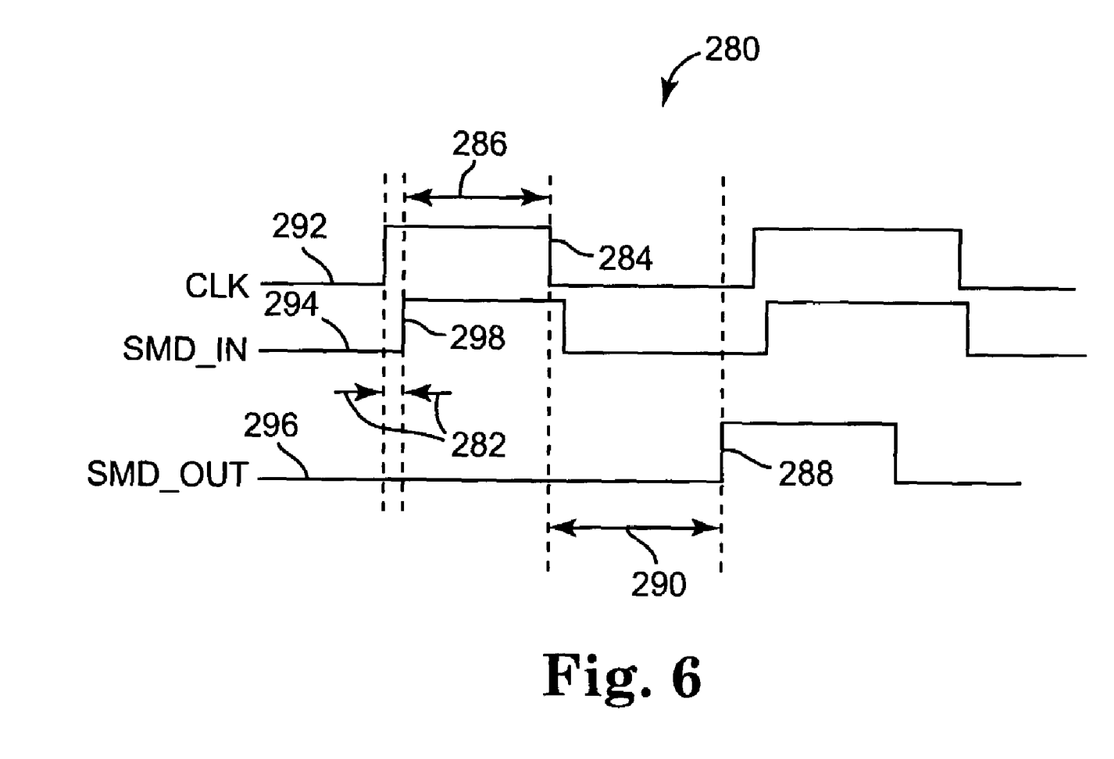
FIG. 6 is a timing diagram illustrating one embodiment of the timing of signals for a synchronous mirror delay circuit.

FIG. 6 is a timing diagram 280 illustrating one embodiment of the timing of signals for synchronous mirror delay circuit 206. Timing diagram 280 includes CLK signal 292 on signal path 218, SMD_IN signal 294 on signal path 216, and SMD_OUT signal 296 on signal path 208. The CLK signal 292 is delayed through delay circuit 213 to provide the SMD_IN signal 294 delayed as indicated at 282. The SMD_OUT signal 296 has a rising edge 288 at a time that is equal to the time of the CLK signal 292 at the falling edge 284 plus the time between the rising edge 298 of the SMD_IN signal 294 and the falling edge 284 of CLK signal 292 as indicated at 286. The time 286 is equivalent to the time indicated at 290. This process is repeated for each cycle of CLK signal 292.

Figure 7:
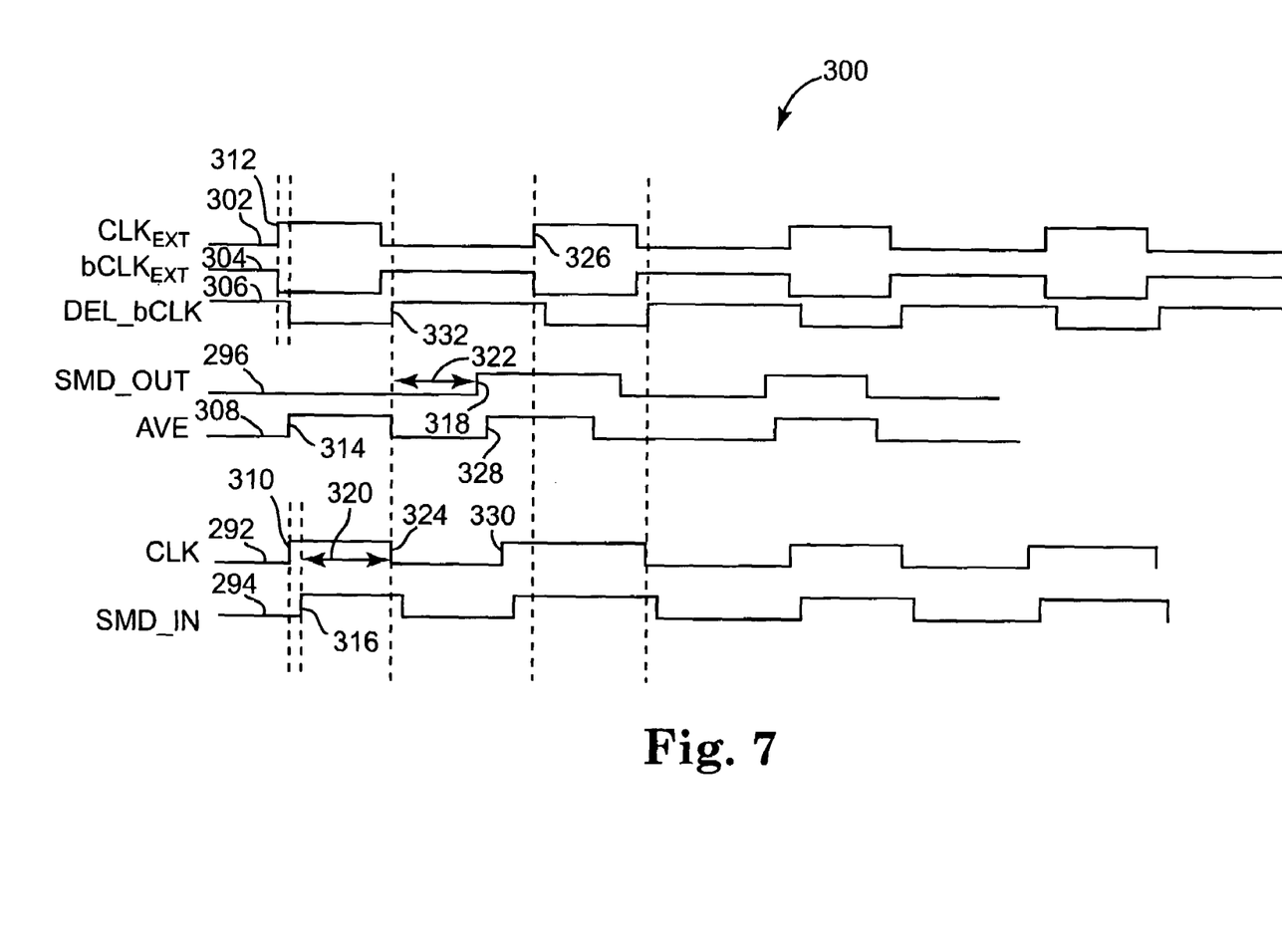
FIG. 7 is a timing diagram illustrating one embodiment of the timing of signals for the correction circuit.

FIG. 7 is a timing diagram 300 illustrating one embodiment of the timing of signals for correction circuit 200. Timing diagram 300 includes $\text{CLK}_{EXT}$ signal 302 on signal path 112, $\text{bCLK}_{EXT}$ signal 304 on signal path 114, DEL_bCLK signal 306 on signal path 212, SMD_OUT signal 296 on signal path 208, AVG signal 308 on signal path 202, CLK signal 292 on signal path 218, and SMD_IN signal 294 on signal path 216.

The DEL_bCLK signal 306 is generated through averaging circuit 210 from $\text{bCLK}_{EXT}$ signal 304. The first rising edge 314 of AVE signal 308 is generated from the rising edge 312 of $\text{CLK}_{EXT}$ signal 302. The rising edge 314 of AVE signal 308 generates the rising edge 310 of CLK signal 292 through duty restoration circuit 204. The rising edge 310 of CLK signal 292 generates the rising edge 316 of SMD_IN signal 294 through delay circuit 213. The falling edge 324 of CLK signal 292 is generated through duty restoration circuit 204 from the rising edge 332 of DEL_bCLK signal 306.

The rising edge 318 of SMD_OUT signal 296 occurs after a time 322 from the falling edge 324 of CLK signal 292. Time 322 is equal to time 320, which is the time between the rising edge 316 of SMD_IN signal 294 and the falling edge 324 of CLK signal 292. From the rising edge 318 of SMD_OUT signal 296 and the rising edge 326 of $\text{CLK}_{EXT}$ signal 302, averaging circuit 214 generates a rising edge 328 of AVE signal 308. The rising edge 328 of AVE signal 308 generates rising edge 330 of CLK signal 292 through duty restoration circuit 204. The process repeats for each cycle of $\text{CLK}_{EXT}$ signal 302.

Figure 8:
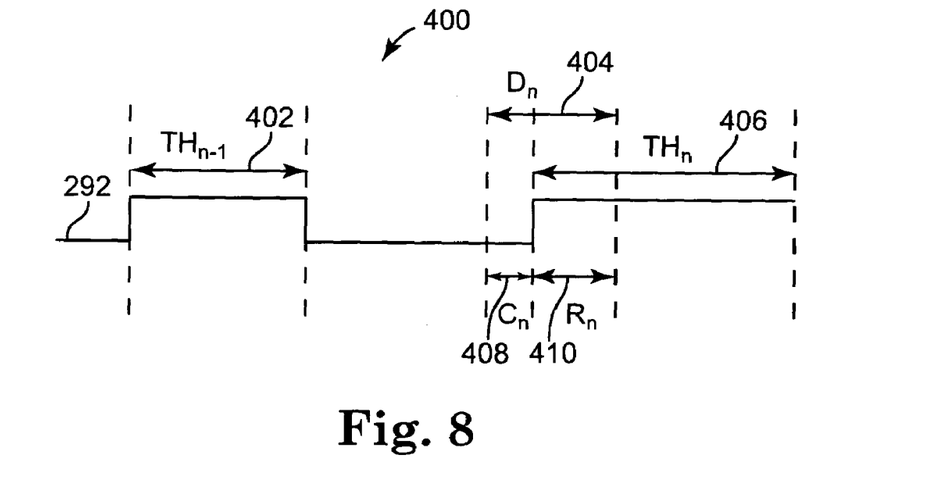
FIG. 8 is a timing diagram illustrating one embodiment of a portion of the output signal of the correction circuit.

FIG. 8 is a timing diagram 400 illustrating one embodiment of a portion of CLK signal 292. CLK signal 292 includes logic high time portion $TH_{n-1}$ 402, logic high time portion $TH_n$ 406, time between the rising edge of SMD_OUT signal 296 and the rising edge of $\text{CLK}_{EXT}$ signal 302 indicated as $D_n$ 404, time between the rising edge of SMD_OUT signal 296 and the rising edge of CLK signal 292 indicated as $C_n$ 408, and time between the rising edge of CLK signal 292 and the rising edge of $\text{CLK}_{EXT}$ signal 302 indicated as $R_n$ 410. The "n" indicates the cycle number for CLK signal 292. The relationships for $TH_{n-1}$, $TH_n$, $D_n$, $C_n$, and $R_n$ are as follows:

$$D_n = (T_{cyc} - 2 \cdot TH_{n-1}) \quad \text{Equation II}$$

$$C_n = X \cdot D_n \quad \text{Equation III}$$

$$R_n = D_n - C_n \quad \text{Equation IV}$$

$$TH_n = \delta \cdot T_{cyc} + R_n \quad \text{Equation V}$$

where $T_{cyc}$ is the cycle time of $CLK_{EXT}$ signal 302, δ is the duty cycle of $CLK_{EXT}$ signal 302, and X is the slope of a curve in graph 260 for averaging circuit 220. For example, for a $CLK_{EXT}$ signal with a duty cycle of 40%, δ=0.4, and X=0.4, CLK signal 292 results in: $TH_0$=0.4·$T_{cyc}$, $TH_1$=0.52·$T_{cyc}$, $TH_2$=0.448·$T_{cyc}$, $TH_3$=0.4912·$T_{cyc}$, $TH_4$=0.46528·$T_{cyc}$, $TH_5$=0.4803·$T_{cyc}$ $TH_6$=0.4718·$T_{cyc}$, etc.

Figure 9:
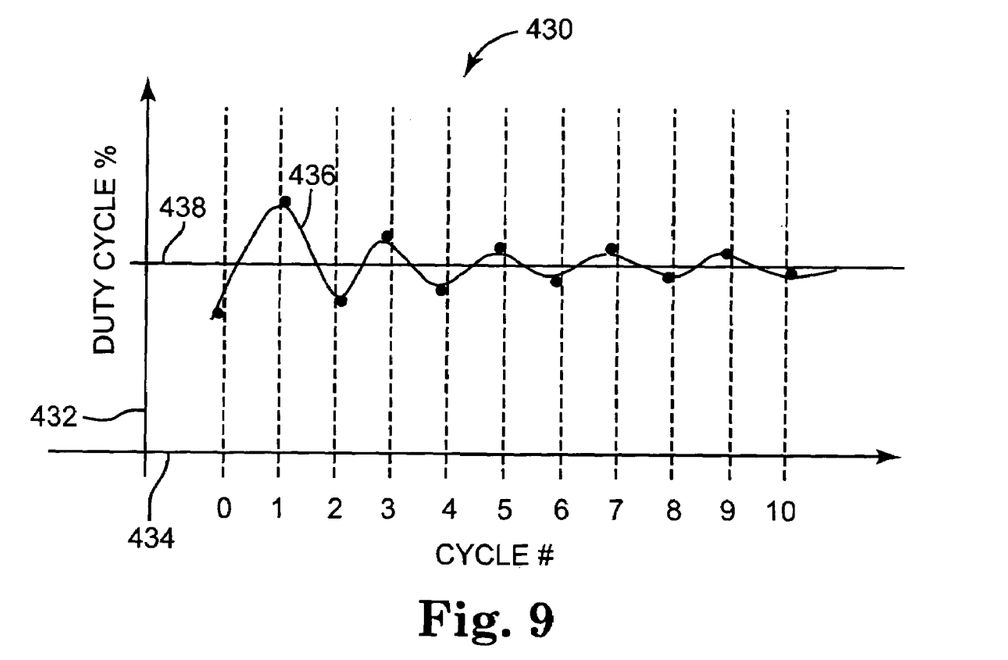
FIG. 9 is a graph illustrating one embodiment of a curve of duty cycle percent verses cycle number for the duty cycle correction circuit.

FIG. 9 is a graph 430 illustrating one embodiment of a curve 436 of duty cycle percent 432 verses cycle number 434. Graph 430 indicates the duty cycle of CLK signal 292 after applying Equations II–V. The duty cycle percent 432 of curve 436 oscillates around a center point 438 as the cycle number increases. After several cycles, curve 436 reaches a steady state based on the duty cycle of $CLK_{EXT}$ signal 302, the value of X for averaging circuit 220, and the final value of $R_n$. The final value of $R_n$ is designated as β. The value for β is calculated as follows:

$$\beta = (1 - 2 \cdot \delta) \cdot \left( \frac{1-X}{2-X} \right)$$ Equation VI Using Equations II–VI, the final amount of duty cycle correction can be determined. For example, for a $CLK_{EXT}$ signal with a duty cycle of 40%, δ=0.4, and an averaging circuit with X=0.6, the duty cycle of the $CLK_{EXT}$ signal can be corrected to 45.7%. The corresponding $bCLK_{EXT}$ signal with a duty cycle of 60%, δ=0.6, and an averaging circuit with X=0.6 can be corrected to 54.3%.

Figure 10:
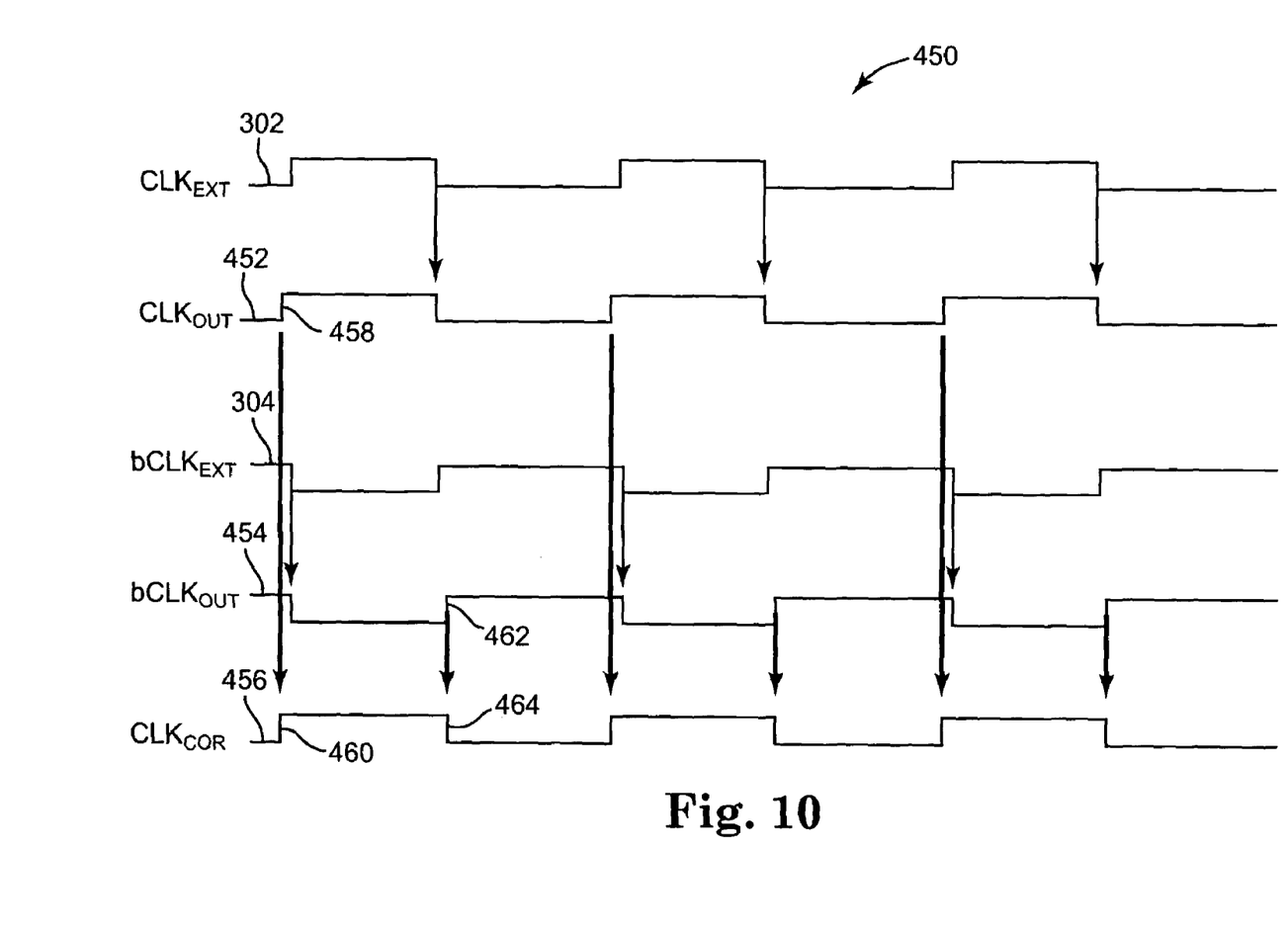
FIG. 10 is a timing diagram illustrating one embodiment of the timing of signals for the duty cycle correction circuit.

FIG. 10 is a timing diagram 450 illustrating one embodiment of the timing of signals for duty cycle correction circuit 110. Timing diagram 450 includes $CLK_{EXT}$ signal 302 on signal path 112, $CLK_{OUT}$ signal 452 on signal path 132, $bCLK_{EXT}$ signal 304 on signal path 114, $bCLK_{OUT}$ signal 454 on signal path 138, and $CLK_{COR}$ signal 456 on signal path 116. For this embodiment, X=0.6 for the averaging circuit of correction circuit 130 and the averaging circuit of correction circuit 136. The duty cycle of $CLK_{EXT}$ signal 302 is 40% and the corresponding duty cycle of $bCLK_{EXT}$ signal 304 is 60%.

The $CLK_{EXT}$ signal 302 having a duty cycle of 40% is corrected to generate $CLK_{OUT}$ signal 452 having a duty cycle of 45.7% through correction circuit 130. The $bCLK_{EXT}$ signal 304 having a duty cycle of 60% is corrected to generate $bCLK_{OUT}$ signal 454 having a duty cycle of 54.3% through correction circuit 136. The rising edge 458 of $CLK_{OUT}$ signal 452 generates the rising edge 460 of $CLK_{COR}$ signal 456 through duty restoration circuit 134. The rising edge 462 of $bCLK_{OUT}$ signal 454 generates the falling edge 464 of $CLK_{COR}$ signal 456 through duty restoration circuit 134. The process repeats for each cycle of $CLK_{EXT}$ signal 302. The duty cycle of $CLK_{COR}$ signal 456 is 50%.

Figure 11A:
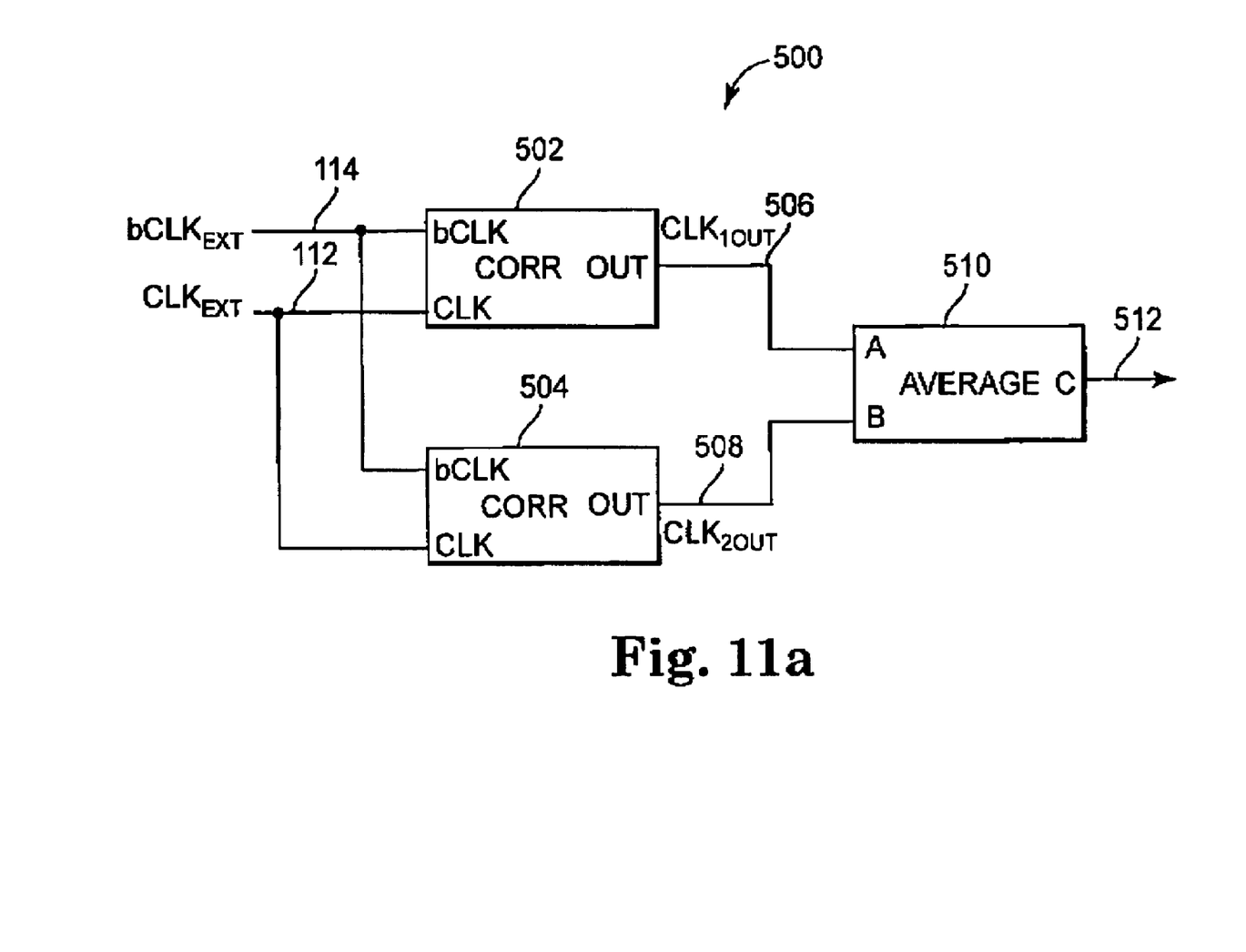
FIGS. 11a and 11b are block diagrams illustrating one embodiment of an improved correction circuit.
Figure 11B:
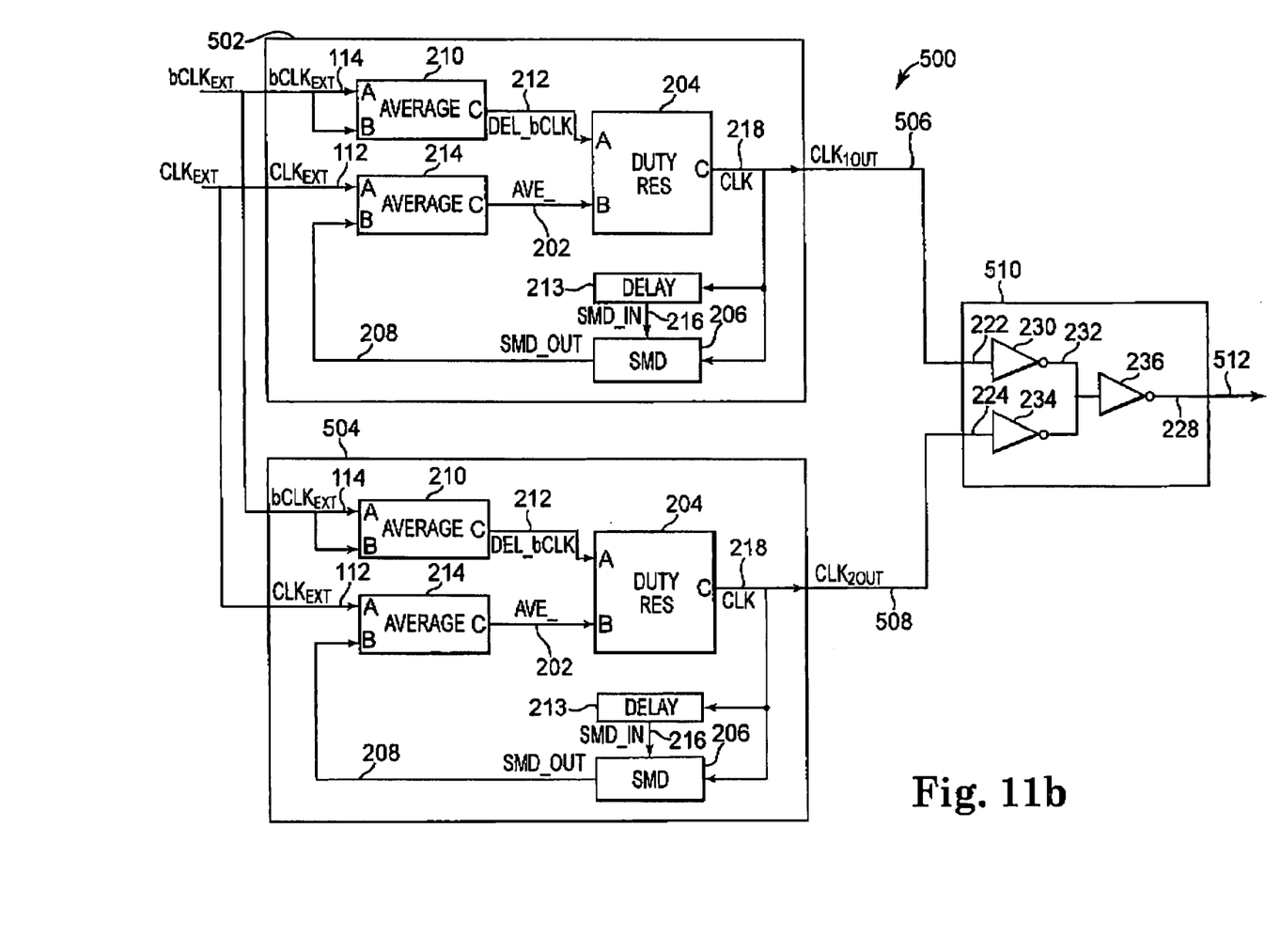

FIGS. 11a and 11b are block diagrams illustrating one embodiment of an improved correction circuit 500. Improved correction circuit 500 can be used in place of correction circuit 130. Improved correction circuit 500 can be used in place of correction circuit 136 by swapping the $bCLK_{EXT}$ signal and $CLK_{EXT}$ signal inputs. Improved correction circuit 500 includes correction circuits 502 and 504 and averaging circuit 510. Correction circuit 502 and correction circuit 504 are similar to correction circuit 200. Averaging circuit 510 is similar to averaging circuit 220.

The bCLK input of correction circuit 502 is electrically coupled to $bCLK_{EXT}$ signal path 114 and the CLK input of correction circuit 502 is electrically coupled to $CLK_{EXT}$ signal path 112. The output of correction circuit 502 is electrically coupled to input A of averaging circuit 510 through $CLK_{1OUT}$ signal path 506. The bCLK input of correction circuit 504 is electrically coupled to $bCLK_{EXT}$ signal path 114 and the CLK input of correction circuit 504 is electrically coupled to $CLK_{EXT}$ signal path 112. The output of correction circuit 504 is electrically coupled to input B of averaging circuit 510 through $CLK_{2OUT}$ signal path 508. The output of averaging circuit 510 is electrically coupled to signal path 512.

Correction circuit 504 is enabled one clock cycle after correction circuit 502. The $CLK_{EXT}$ signal is duty cycle corrected by correction circuit 502 to output the $CLK_{1OUT}$ signal to averaging circuit 510 through signal path 506. The $CLK_{EXT}$ signal is also duty cycle corrected by correction circuit 504 to output the $CLK_{2OUT}$ signal to averaging circuit 510 through signal path 508. The $CLK_{2OUT}$ signal is similar to the $CLK_{1OUT}$ signal, but is delayed one clock cycle to the $CLK_{1OUT}$ signal. The $CLK_{1OUT}$ signal and the $CLK_{2OUT}$ signal are averaged by averaging circuit 510. Averaging circuit 510 outputs a corrected clock signal on signal path 512. Improved correction circuit 500 can be used in place of correction circuit 136 to correct the duty cycle of the $bCLK_{EXT}$ signal by swapping the $bCLK_{EXT}$ signal and $CLK_{EXT}$ signal inputs.

Figure 12:
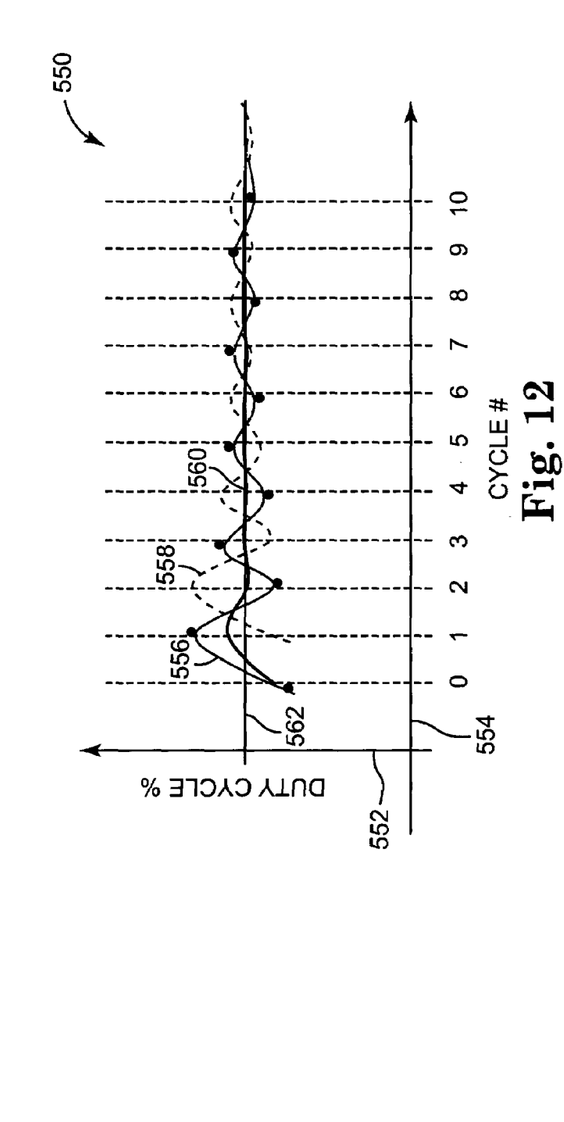
FIG. 12 is a graph illustrating one embodiment of a curve of duty cycle percent verses cycle number for the improved correction circuit.

FIG. 12 illustrates a graph 550 illustrating one embodiment of a curve 560 of duty cycle percent 552 verses cycle number 554 for improved correction circuit 500. Curve 556 indicates the duty cycle 552 of the $CLK_{1OUT}$ signal on signal path 506. Curve 556 oscillates around a center point 562, such as 50%. Curve 558 indicates the duty cycle 552 of the $CLK_{2OUT}$ signal on signal path 508. Curve 558 also oscillates around center point 562. Curve 558 is similar to curve 556 but is delayed by one clock cycle. Curve 560 indicates the duty cycle 552 of the output signal of averaging circuit 510 on signal path 512. Curve 560 is close to the center point 562. Improved correction circuit 500 results in less jitter in the output signal on signal path 512.

Figure 13:
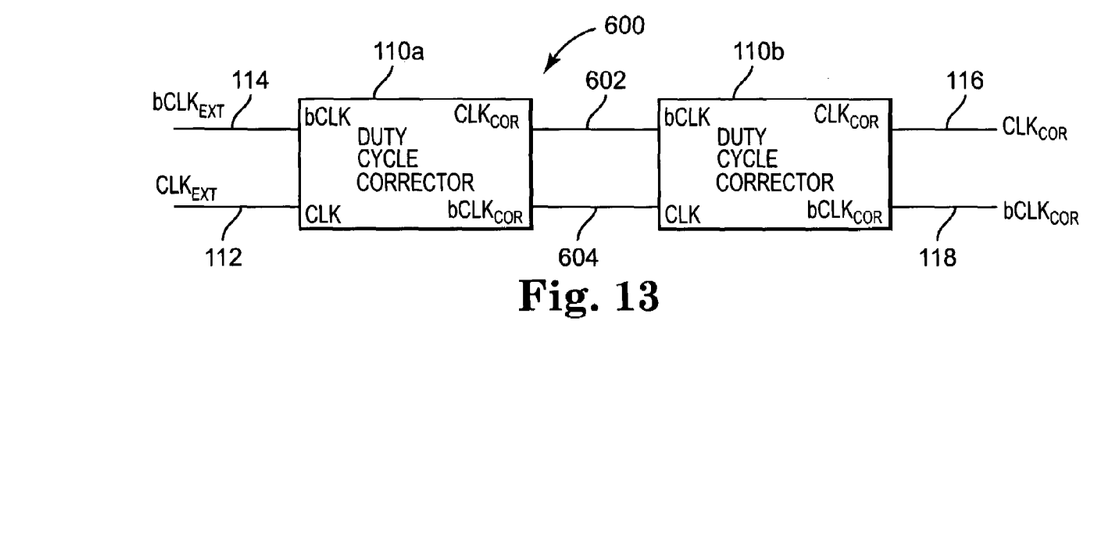
FIG. 13 is a diagram illustrating one embodiment of an improved duty cycle correction circuit.

FIG. 13 is a block diagram illustrating one embodiment of an improved duty cycle correction circuit 600. Improved duty cycle correction circuit 600 includes duty cycle correction circuits 110a and 110b. Duty cycle correction circuits 110a and 110b are similar to duty cycle correction circuit 110.

The bCLK input of duty cycle correction circuit 110a is electrically coupled to $bCLK_{EXT}$ signal path 114 and the CLK input of duty cycle correction circuit 110a is electrically coupled to $CLK_{EXT}$ signal path 112. The $CLK_{COR}$ output of duty cycle correction circuit 110a is electrically coupled to the bCLK input of duty cycle correction circuit 110b through signal path 602. The $bCLK_{COR}$ output of duty cycle correction circuit 110a is electrically coupled to the CLK input of duty cycle correction circuit 110b through signal path 604. The $CLK_{COR}$ output of duty cycle correction circuit 110b is electrically coupled to $CLK_{COR}$ signal path 116 and the $bCLK_{COR}$ output of duty cycle correction circuit 110b is electrically coupled to $bCLK_{COR}$ signal path 118.

Any suitable number of duty cycle correction circuits 110 can be coupled together as duty cycle correction circuit 110a and duty cycle correction circuit 110b to provide an improved duty cycle correction circuit. Each successive duty cycle correction circuit 110 further improves on the duty cycle correction of the previous duty cycle correction circuit 110.

What is claimed is:

1. A duty cycle correction system comprising:
   a first circuit configured to receive a clock signal and output a corrected clock signal having a first duty cycle closer to 50% than the clock signal;
   a second circuit configured to receive an inverted clock signal and output a corrected inverted clock signal having a second duty cycle closer to 50% than the inverted clock signal; and
   a third circuit configured to receive the corrected clock signal and the corrected inverted clock signal and provide a first signal having a third duty cycle closer to 50% than the corrected clock signal and the corrected inverted clock signal;
   wherein the first circuit comprises:
      an averaging circuit configured to receive the clock signal and a second signal and provide a third signal;
      a duty restoration circuit configured to receive the third signal and the inverted clock signal and provide the corrected clock signal; and
      a synchronous mirror delay circuit configured to receive the corrected clock signal and provide the second signal.

2. A duty cycle correction system comprising:
   a first circuit configured to receive a clock signal and output a corrected clock signal having a first duty cycle closer to 50% than the clock signal;
   a second circuit configured to receive an inverted clock signal and output a corrected inverted clock signal having a second duty cycle closer to 50% than the inverted clock signal; and
   a third circuit configured to receive the corrected clock signal and the corrected inverted clock signal and provide a first signal having a third duty cycle closer to 50% than the corrected clock signal and the corrected inverted clock signal;
   wherein the second circuit comprises:
      an averaging circuit configured to receive the inverted clock signal and a second signal and provide a third signal;
      a duty restoration circuit configured to receive the third signal and the clock signal and provide the corrected inverted clock signal; and
      a synchronous mirror delay circuit configured to receive the corrected inverted clock signal and provide the second signal.

3. The duty cycle correction system of claim 1, wherein the third circuit is configured to provide the first signal having a first transition on a transition of the corrected clock signal and a second transition on a transition of the corrected inverted clock signal.

4. The duty cycle correction system of claim 3, wherein the first transition is a rising edge, the second transition is a falling edge, the transition of the corrected clock signal is a rising edge, and the transition of the corrected inverted clock signal is a rising edge.

5. A duty cycle correction system comprising:
   a first circuit configured to receive a clock signal and output a corrected clock signal having a first duty cycle closer to 50% than the clock signal;
   a second circuit configured to receive an inverted clock signal and output a corrected inverted clock signal having a second duty cycle closer to 50% than the inverted clock signal; and
   a third circuit configured to receive the corrected clock signal and the corrected inverted clock signal and provide a first signal having a third duty cycle closet to 50% than the corrected clock signal and the corrected inverted clock signal;
   wherein the first circuit comprises:
      a first averaging circuit configured to receive the clock signal and a second signal and provide a third signal;
      a first duty restoration circuit configured to receive the third signal and the inverted clock signal and provide a fourth signal;
      a first synchronous mirror delay circuit configured to receive the fourth signal and provide the second signal;
      a second averaging circuit configured to receive the clock signal and a fifth signal and provide a sixth signal;
      a second duty restoration circuit configured to receive the sixth signal and the inverted clock signal and provide a seventh signal;
      a second synchronous minor delay circuit configured to receive the seventh signal and provide the fifth signal; and
      a third averaging circuit configured to receive the fourth signal and the seventh signal and provide the corrected clock signal,
      wherein the second averaging circuit, the second duty restoration circuit, and the second synchronous mirror delay circuit are enabled one clock cycle after the first averaging circuit, the first duty cycle correction circuit, and the first synchronous mirror delay circuit.

6. A duty cycle correction system comprising:
   a first circuit configured to receive a clock signal and output a corrected clock signal having a first duty cycle closer to 50% than the clock signal;
   a second circuit configured to receive an inverted clock signal and output a corrected inverted clock signal having a second duty cycle closer to 50% than the inverted clock signal; and
   a third circuit configured to receive the corrected clock signal and the corrected inverted clock signal and provide a first signal having a third duty cycle closer to 50% than the corrected clock signal and the corrected inverted clock signal;
   wherein the second circuit comprises:
      a first averaging circuit configured to receive the inverted clock signal and a second signal and provide a third signal;
      a first duty restoration circuit configured to receive the third signal and the clock signal and provide a fourth signal;
      a first synchronous mirror delay circuit configured to receive the fourth signal and provide the second signal;
      a second averaging circuit configured to receive the inverted clock signal and a fifth signal and provide a sixth signal;
      a second duty restoration circuit configured to receive the sixth signal and the clock signal and provide a seventh signal;
      a second synchronous mirror delay circuit configured to receive the seventh signal and provide the fifth signal; and
      a third averaging circuit configured to receive the fourth signal and the seventh signal and provide the corrected inverted clock signal,
      wherein the second averaging circuit, the second duty restoration circuit, and the second synchronous mirror delay circuit are enabled one clock cycle after the first averaging circuit, the first duty cycle correction circuit, and the first synchronous mirror delay circuit.

7. A duty cycle correction system comprising:
a first circuit configured to receive a clock signal and output a corrected clock signal having a first duty cycle closer to 50% than the clock signal;
a second circuit configured to receive an inverted clock signal and output a corrected inverted clock signal having a second duty cycle closer to 50% than the inverted clock signal;
a third circuit configured to receive the corrected clock signal and the corrected inverted clock signal and provide a first signal having a third duty cycle closer to 50% than the corrected clock signal and the corrected inverted clock signal;
a fourth circuit configured to receive the corrected clock signal and output a second corrected clock signal having a fourth duty cycle closer to 50% than the corrected clock signal;
a fifth circuit configured to receive the corrected inverted clock signal and output a second corrected inverted clock signal having a fifth duty cycle closer to 50% than the corrected inverted clock signal; and
a sixth circuit configured to receive the second corrected clock signal and the second corrected inverted clock signal and output a second signal having a sixth duty cycle closer to 50% than the second corrected clock signal and the second corrected inverted clock signal.

8. The duty cycle correction system of claim 1, wherein the duty cycle of the first signal is 50%.

9. A method for correcting the duty cycle of a clock signal, the method comprising:
receiving a clock signal;
providing a corrected clock signal having a first duty cycle closer to 50% than the clock signal in response to the clock signal;
receiving an inverted clock signal;
providing a corrected inverted clock signal having a second duty cycle closer to 50% than the inverted clock signal in response to the inverted clock signal; and
providing a first signal having a third duty cycle closer to 50% than the corrected clock signal and the corrected inverted clock signal in response to the corrected clock signal and the corrected inverted clock signal;
wherein providing the corrected clock signal comprises:
averaging the clock signal and a second signal to provide a third signal;
generating the corrected clock signal in response to the third signal and the inverted clock signal; and
synchronous mirror delaying the corrected clock signal to provide the second signal.

10. A method for correcting the duty cycle of a clock signal, the method comprising:
receiving a clock signal;
providing a corrected clock signal having a first duty cycle closer to 50% than the clock signal in response to the clock signal;
receiving an inverted clock signal;
providing a corrected inverted clock signal having a second duty cycle closer to 50% than the inverted clock signal in response to the inverted clock signal; and
providing a first signal having a third duty cycle closer to 50% than the corrected clock signal and the corrected inverted clock signal in response to the corrected clock signal and the corrected inverted clock signal;
wherein providing the corrected inverted clock signal comprises:
averaging the inverted clock signal and a second signal to provide a third signal;
generating the corrected inverted clock signal in response to the third signal and the clock signal; and
synchronous mirror delaying the corrected inverted clock signal to provide the second signal.

11. The method of claim 9, wherein providing the first signal comprises providing the first signal having a first transition in response to a transition of the corrected clock signal and a second transition in response a transition of the corrected inverted clock signal.

12. The method of claim 11, wherein providing the first signal comprises providing the first signal having a rising edge in response to a rising edge of the corrected clock signal and a falling edge in response to a rising edge of the corrected inverted clock signal.

13. A method for correcting the duty cycle of a clock signal, the method comprising:
receiving a clock signal;
providing a corrected clock signal having a first duty cycle closer to 50% than the clock signal in response to the clock signal;
receiving an inverted clock signal;
providing a corrected inverted clock signal having a second duty cycle closer to 50% than the inverted clock signal in response to the inverted clock signal; and
providing a first signal having a third duty cycle closer to 50% tan the corrected clock signal and the corrected inverted clock signal in response to the corrected clock signal and the corrected inverted clock signal;
wherein providing the corrected clock signal comprises;
averaging the clock signal and a second signal to provide a third signal;
generating a fourth signal in response to the third signal and the inverted clock signal;
synchronous mirror delaying the fourth signal to provide the second signal;
averaging the clock signal and a fifth signal to provide a sixth signal one clock cycle after averaging the clock signal and the second signal;
generating a seventh signal in response to the sixth signal and the inverted clock signal one clock cycle after generating the fourth signal;
synchronous mirror delaying the seventh signal to provide the fifth signal; and
averaging the fourth signal and the seventh signal to provide the corrected clock signal.

14. A method for correcting the duty cycle of a clock signal, the method comprising:
receiving a clock signal;
providing a corrected clock signal having a first duty cycle closer to 50% than the clock signal in response to the clock signal;
receiving an inverted clock signal;
providing a corrected inverted clock signal having a second duty cycle closer to 50% than the inverted clock signal in response to the inverted clock signal; and
providing a first signal having a third duty cycle closer to 50% than the corrected clock signal and the corrected inverted clock signal in response to the corrected clock signal and the corrected inverted clock signal;
wherein providing the corrected inverted clock signal comprises:
averaging the inverted clock signal and a second signal to provide a third signal;

generating a fourth signal in response to the third signal and the clock signal;

synchronous minor delaying the fourth signal to provide the second signal;

averaging the inverted clock signal and a fifth signal to provide a sixth signal one clock cycle after averaging the inverted clock signal and the second signal;

generating a seventh signal in response to the sixth signal and the clock signal one clock cycle after generating the fourth signal;

synchronous mirror delaying the seventh signal to provide the fifth signal; and averaging the fourth signal and the seventh signal to provide the corrected inverted clock signal.

15. A method for correcting the duty cycle of a clock signal, the method comprising:

receiving a clock signal;

providing a corrected clock signal having a first duty cycle closer to 50% than the clock signal in response to the clock signal;

receiving an inverted clock signal;

providing a corrected inverted clock signal having a second duty cycle closer to 50% than the inverted clock signal in response to the inverted clock signal;

providing a first signal having a third duty cycle closer to 50% than the corrected clock signal and the corrected inverted clock signal in response to the corrected clock signal and the corrected inverted clock signal;

providing a second corrected clock signal having a fourth duty cycle closer to 50% than the corrected clock signal in response to the corrected clock signal;

providing a second corrected inverted clock signal having a fifth duty cycle closer to 50% than the corrected inverted clock signal in response to the corrected inverted clock signal; and providing a second signal having a sixth duty cycle closer to 50% than the second corrected clock signal and the second corrected inverted clock signal in response to the second corrected clock signal and the second corrected inverted clock signal.

16. The method of claim 9, wherein providing the first signal comprises providing the first signal having a duty cycle of 50%.

17. A duty cycle correction system comprising:

means for generating a corrected clock signal in response to a clock signal, the corrected clock signal having a first duty cycle closer to 50% than the clock signal;

means for generating a corrected inverted clock signal in response to an inverted clock signal, the corrected inverted clock signal having a second duty cycle closer to 50% than the inverted clock signal; and means for generating a first signal in response to the corrected clock signal and the corrected inverted clock signal, the first signal having a third duty cycle closer to 50% than the corrected clock signal and the corrected inverted clock signal;

wherein the means for generating the corrected clock signal comprises:

means for averaging the clock signal and a second signal to provide a third signal;

means for restoring a duty cycle based on the third signal and the inverted clock signal to provide the corrected clock signal; and means for synchronous mirror delaying the corrected clock signal to provide the second signal.

18. The duty cycle correction system of claim 17, wherein the third duty cycle is approximately 50%.

* * * * *